(12) United States Patent
Suozzo et al.

(10) Patent No.: US 8,076,923 B2
(45) Date of Patent: Dec. 13, 2011

(54) DEAD-LINE PHASE IDENTIFICATION SYSTEM AND METHOD THEREOF

(75) Inventors: Anthony Suozzo, Harrison, NY (US); Harold I. Marsden, Westborough, MA (US); Aaron P. Coolidge, Northborough, MA (US); Daniel P. Eggleston, Shrewsbury, MA (US)

(73) Assignees: Consolidated Edison Company of New York, Inc., New York, NY (US); Power Systems Integrity, Inc., Westborough, MA (US)

( * ) Notice: Subject to any disclaimer, the term of this patent is extended or adjusted under 35 U.S.C. 154(b) by 712 days.

(21) Appl. No.: 12/126,447

(22) Filed: May 23, 2008

(65) Prior Publication Data
US 2009/0289616 A1 Nov. 26, 2009

(51) Int. Cl.
*G01R 19/00* (2006.01)
(52) U.S. Cl. .......................................................... 324/66
(58) Field of Classification Search ...................... 324/66
See application file for complete search history.

(56) References Cited

U.S. PATENT DOCUMENTS

| | | | | |
|---|---|---|---|---|
| 5,144,226 A | * | 9/1992 | Rapp | 324/132 |
| 5,493,206 A | * | 2/1996 | Boons | 324/66 |
| 5,510,700 A | | 4/1996 | Pomatto | |
| 6,642,700 B2 | * | 11/2003 | Slade et al. | 324/66 |
| 6,667,610 B2 | | 12/2003 | Piesinger | |
| 6,963,216 B2 | * | 11/2005 | Smith | 324/762.07 |
| 7,031,859 B2 | * | 4/2006 | Piesinger | 702/72 |
| 7,057,401 B2 | * | 6/2006 | Blades | 324/713 |
| 2006/0113984 A1 | | 6/2006 | Marsden et al. | |

* cited by examiner

*Primary Examiner* — Jeff Natalini
(74) *Attorney, Agent, or Firm* — Cantor Colburn LLP (57) ABSTRACT

A system and method for dead-line conductor phase identification is provided. The system includes a receiver unit having a set of current sensors, such as current transformers. The receiver unit current sensors are coupled to conductors having a known phase in a multiphase power line. The current sensors are positioned adjacent a transformer connected to a section of the power line having an open circuit condition. A transmitter unit transmits a current signal on to a conductor at the open circuit section of the power line. The current sensors detect the current signal and the receiver unit transmits a signal to the transmitter unit identifying the phase on which the current signal was transmitted.

19 Claims, 9 Drawing Sheets

DEAD-LINE PHASE IDENTIFICATION SYSTEM AND METHOD THEREOF

BACKGROUND OF THE INVENTION

The present invention relates generally to a system for determining the electrical phase of a conductor and more particularly to a system that determines the electrical phase of a conductor with an open circuit condition in a multiphase electrical power line.

The generation of electrical power is generally performed in large centrally located plants. These power plants use a fuel, such as coal or natural gas, to generate heat to create steam. The steam then expands through a turbine causing the turbine to rotate. This rotation is transferred to an electrical generator that creates rotating magnetic fields that produce electricity through induction. This type of electrical power is known as alternating current. Electrical generators of this type are typically arranged to generate three electrical currents or "phases" that are arranged 120 degrees apart. These phases are typically designated as the "A", "B", and "C" phases.

Each of the electrical phases is transmitted on a separate conductor with a layer of insulation surrounding each of the conductors. The insulation allows the routing of the conductors together from the generation plant to the end users while keeping the conductors electrically isolated from each other. Unfortunately, due to a variety of factors, including new construction, network expansion, environmental effects, or abrasions and mechanical wear for example, an open circuit condition may occur. In some cases the insulation between the electrical phases may deteriorate causing an electrical fault. These type of faults may also be the result of other causes, such as lightening strikes, or trees falling across the power lines for example. When a gap is created in the insulation a dielectric breakdown may occur causing a phase-to-phase short. This type of failure releases of a large amount of energy damaging the conductors and may result in the conductor physically breaking causing an open circuit condition.

When an open circuit condition such as that described above occurs, personnel are dispatched by the utilities to repair or reconnect the conductors. In the case of a failure caused by a phase-to-phase short, the conductors may be split and it is difficult for the lineman to identify which conductor is associated with which electrical phase. Identification of the correct phase is important for the proper operation of the power system. The crossing of phases during repairs will result in having to re-work the splice and risk potential failures that could damage the conductors and other equipment in the electrical network.

Before any work can be performed on the conductors, the feeder circuit in the distribution network needs to be identified and protected (grounded) for work. The method of identifying the feeder circuit will depend on how the conductors were damaged. If only one of the conductors is broken, applying a tracing current to the two remaining conductors can identify the feeder circuit. This technique is effective because the remaining conductors provide a return path for the tracer current.

When the fault causes a break in all three conductors, the tracing current method will not be effective since there is no return path. In this case, a spear is applied to the cable shorting all three conductors. This creates a path for the tracing current so that the feeder can be identified. However, the phase of each cable cannot be identified with the spear in place.

Commonly, the identification of the phases and the repairs of the cables are performed by separate personnel: a Splicer who repairs and splices the conductors back together, and a phase identification crew. Separate personnel are used because the tracing method used for identifying the phase requires additional special training. Further, the phase identification crew needs to locate and travel to the transformers located on either side of the section having an open circuit condition. The transformers are grounded, isolating the section having an open circuit condition. The Splicer then prepares the conductors for splicing. The identification crew applies an audio frequency tracing tone to the conductors on the transformer side of the conductor and then travels back to the section having the open circuit condition. The phase identification crew uses the trace tone to identify and label the phase on each of the conductors. This is repeated for each set (3 conductors) of cable ends that need to be spliced. In the case of medium voltage transmission cables, the transformers are located a distance from the location of the failure. It is time consuming for the phase identification crew to travel, set up to enter an underground structure to perform the splice, and then perform the testing required to establish the phases. In addition, multiple trips may be required. This is performed for each set of cable ends (a minimum of two).

Once the conductors are labeled, the Splicer may complete the repair and splice the conductors on either side of the open circuit section back together. The power lines may then be re-energized and electrical service restored.

The process of identifying and repairing conductors in a three phase system is time consuming and expensive. Further, the above process of applying a tracing current is not feasible when an open circuit is encountered. While the existing processes and systems for identifying and repairing three phase conductors are suitable for their intended purposes, there still remains a need for improvements particularly regarding the reduction of the amount of time required to make repairs. Further improvements are also needed to increase the reliability of the splicing repairs to avoid the need to re-work the repair.

SUMMARY OF THE INVENTION

A system for identifying an electrical phase of a conductor is provided. The system includes a first current sensor electrically coupled to a first controller. A first communications device is electrically coupled to the first controller. A second communications device is operably coupled to receive a signal from the first communications device. A second controller is electrically coupled to the second communications device and a power supply. A switching circuit is electrically coupled to the power supply and the second controller. A test conductor is coupled to the switching circuit.

A method of determining an electrical phase of a conductor in a three-phase cable having a first end and a second end is also provided. The method includes the step of coupling a first current sensor to a first conductor on the first end. A second current sensor is coupled to a second conductor on the first end. A third current sensor is coupled to a third conductor on the first end. An electrical current is applied to a conductor on the second end. A signal is transmitted in response to detecting a current on the first conductor, the second conductor, or the third conductor on the first end. Finally, a visual indication is provided if the current was detected on the first conductor.

A method of joining conductors in a multiphase electrical power line having a section with an open circuit condition is also provided. The method includes the steps of grounding a first transformer. A first set of current sensors is coupled to the conductors of the multiphase electrical power line adjacent to the first transformer, wherein each of the current sensors in the first set of current sensors is associated with one of the conductors. A first current is transmitted to one of the conductors adjacent the multiphase electrical power line failed section. The first current is detected with one of the first set of current sensors. Finally, a first signal is transmitted indicating which conductor the first current was detected, wherein the first signal also includes a signal indicating that the first current was detected adjacent to the first transformer.

A system for identifying an electrical phase of a conductor is also provided. The system includes a receiver unit having at least one current sensor. A controller is operably coupled to current sensor and a communications transmitter. A transmitter unit is provided having at least one test lead and a neutral lead. The transmitter unit has a controller operably coupled to the test lead and the neutral lead. A communications receiver is operably coupled to the controller and the communications transmitter. The transmitter controller is arranged to receive data and instructions as inputs and provide data and instructions as outputs. The transmitter controller data inputs describe: a phase identification that a current signal was detected; an identification of a transformer where the current signal was detected; a location of a failure; a number of conductors involved with the failure; a type of repair; a repair start time; a repair end time; and an identity of a repair personnel. The transmitter controller instruction inputs enable the transmitter controller to determine when to transmit data. The transmitter controller output data describes: the location of a failure; the number of conductors involved with the failure; the type of repair; the repair start time; the repair end time; and the identity of a repair personnel. The transmitter controller instruction outputs enable the activation of an indicator associated with the identified phase conductor.

BRIEF DESCRIPTION OF THE DRAWINGS

Referring now to the drawings, which are meant to be exemplary and not limiting, and wherein like elements are numbered alike.

DETAILED DESCRIPTION

Figure 1:
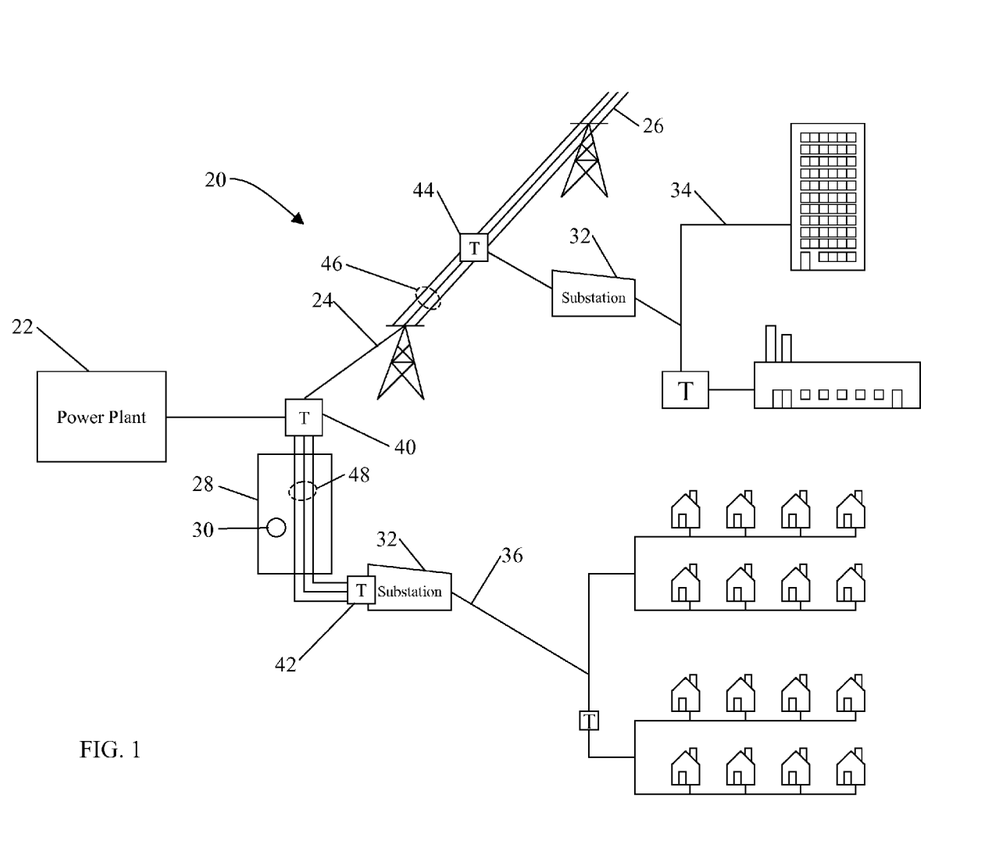
FIG. 1 is a schematic illustration of a utility electrical distribution system.

FIG. 1 illustrates an exemplary embodiment of a utility electrical distribution network 20. The utility network 20 includes one or more power plants 22 connected in parallel to a main distribution network 24. The main distribution network 24 includes aboveground portions 26 that utilize towers to carry three phase conductors. It should be appreciated that as used herein, the term "conductor" means a medium capable of transferring electrical power, including but not limited conductors and cables for example. The main distribution network 24 may further include under-ground portions 28. The under-ground portions 28 are typically accessed through manholes 30. The power plants 22 may include, but are not limited to: coal, nuclear, natural gas, or incineration power plants. Additionally, the power plants 22 may include one or more hydroelectric, solar, or wind turbine power plants. It should be appreciated that additional components such as transformers, switchgear, fuses and the like (not shown) may be incorporated into the utility network 20 as needed to ensure the safe and efficient operation of the system. The utility network 20 may be also be interconnected with one or more other utility networks to allow the transfer of electrical power into or out of the utility network 20.

The main distribution network 24 typically consists of medium voltage power lines, less than 50 kV for example, and associated distribution equipment which carry the electrical power from the point of production at the power plants 22 to the end users located on local electrical distribution networks 34, 36. In the exemplary embodiment, the main distribution network 24 is a three-phase electrical network having "A" phase, a "B" phase, a "C" phase and a neutral for example. The local distribution networks 34, 36 are connected to the main distribution network 24 by substations 32 which adapt the electrical characteristics of the electrical power to those needed by the end users. Substations 32 typically contain one or more transformers, switching, protection and control equipment. The main distribution network 24 may include transformers 40, 42, 44 that modify the characteristics of the electrical power during transmission. Larger substations may also include circuit breakers to interrupt faults such as short circuits or over-load currents that may occur. Substations 32 may also include equipment such as fuses, surge protection, controls, meters, capacitors and voltage regulators.

The substations 32 connect to one or more local electrical distribution networks, such as local distribution network 34, for example, that provides electrical power to a commercial area having end users such as an office building or a manufacturing facility. Local distribution network 34 may also include one or more transformers that further adapt the electrical characteristics of the delivered electricity to the needs of the end users. Substation 32 may also connect with other types of local distribution networks such as residential distribution network 36. The residential distribution network 36 may include one or more residential buildings and also light industrial or commercial operations.

Due to a variety of factors, including environmental effects such as lightening strikes for example, new construction, or network expansion activities the conductors in the utility network 20 may experience an open circuit condition, such as a failure caused by a phase-to-phase short for example. These open circuit conditions may occur anywhere in the network 20 including in the aboveground section 26, at location designated as 46 for example. The open circuit condition may also occur in the belowground section 28, at the location designated as 48 for example. The failure of the conductor in the main distribution network 24 typically results in the loss of electrical power service to the local distribution networks 34, 36 and the end user customers. The utility provider that operates the distribution network 24 will promptly dispatch repair crews to make the appropriate repairs so service may be restored.

Figure 2:
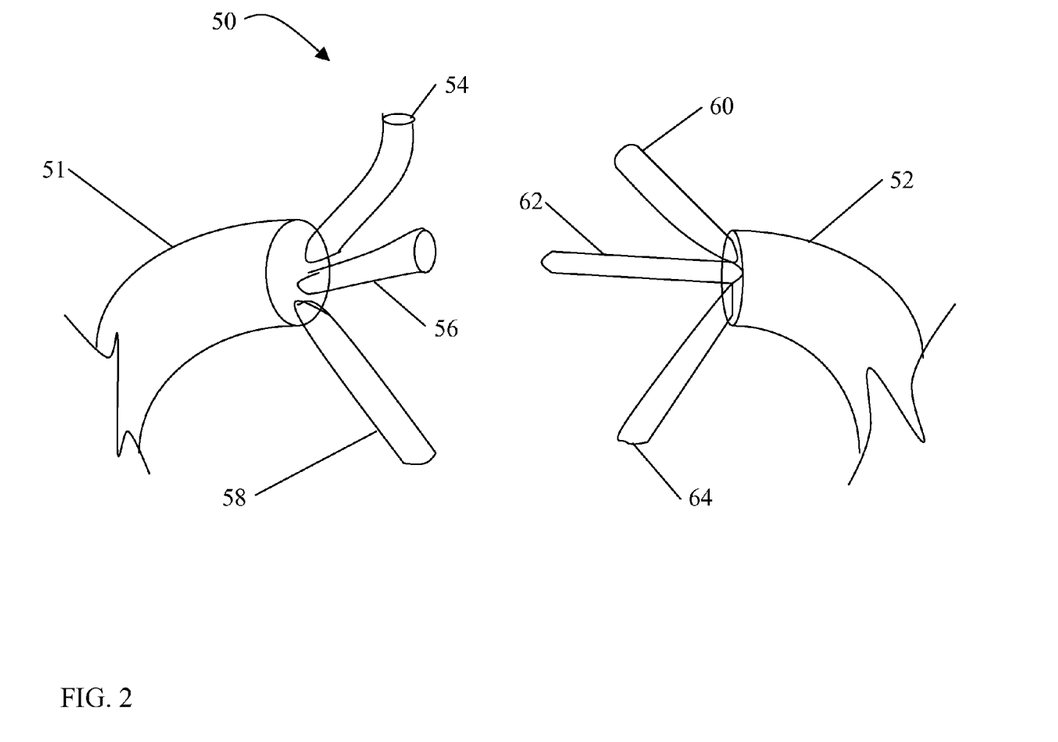
FIG. 2 is a perspective view illustration of a three phase conductor at the location of a fault.

The open circuit condition, such as a failure for example, causes a break in the cable 50 into a first section 51 and a second section 52, as shown in FIG. 2. Additional issues are created when the open circuit condition occurs in a three-phase transmission section of the utility network 20 such as at location 46 or location 48 for example. When an open circuit occurs in these areas, each section of the cable 50 has three individual phase conductors 54, 56, 58 and phased conductors 60, 62, 64 as illustrated in FIG. 2. Before the connections may be made, the individual phase conductors need to be correctly identified. If the phase conductors from section 51 are incorrectly spliced with the corresponding phase conductors in section 52, damage may result to the equipment on distribution network 24. It should be appreciated that this failure may occur at any location along the distribution network 24. It should be further appreciated that these types of conditions may also occur in any type of electrical distribution, electrical transmission or power delivery system. As used herein, an electrical distribution, electrical transmission or power delivery system means any power generation system, power transmission system, power distribution system and may also include commercial, industrial, residential or nautical power delivery systems. The electrical transmission system may also have more than three phases, such as a six-phase or ten-phase transmission system. Further, while for exemplary purposes, the open circuit condition will be discussed herein as being located at position 48, the claimed subject matter is not so limited.

Figure 3:
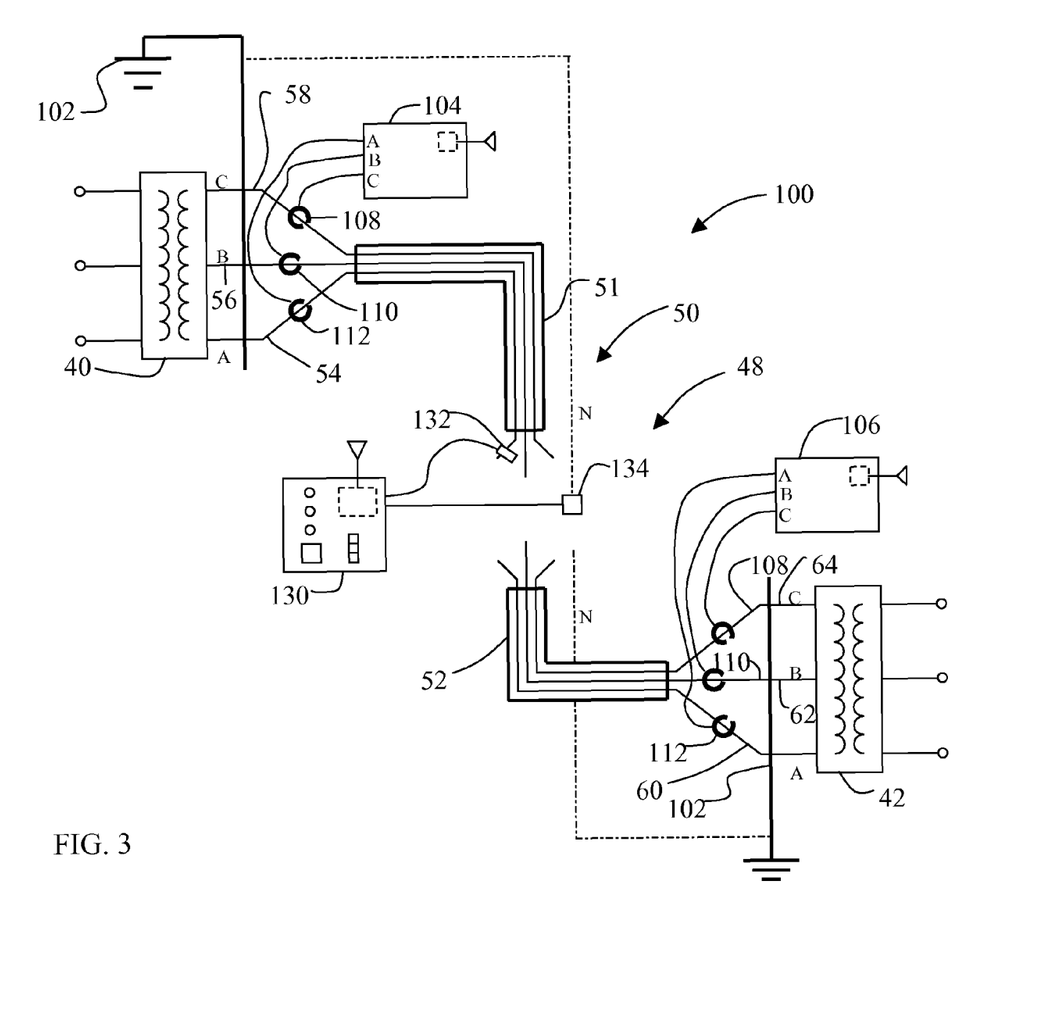
FIG. 3 is a schematic illustration of an exemplary embodiment dead-line phase identification system.

Referring now to FIG. 3, an exemplary embodiment deadline phase conductor identification system 100 and method will be discussed. The open circuit condition at location 48 results in a break in the conductor 50 into two sections 51, 52 as discussed above. The utility dispatches a repair crew that first connects a ground 102 to the transformer 40, 42 grounding the transformers that are located on either side of location 48. By grounding the transformers 40, 42, the cable sections 51, 52 are electrically isolated from the distribution network 24, allowing the repairs and connections to be made. After grounding the transformers 40,42, the repair crew couples a phase identifier receiver unit 104, 106 to the cable 51, 52 respectively. Each receiver unit 104, 106 includes three current sensors 108, 110, 112 that are coupled to the "A" phase conductor 54, 60, the "B" phase conductor 56, 62, and the "C" phase conductors 58, 64 respectively. In one alternate embodiment, the receiver unit 104, 106 has only two current sensors, however, the use of three current sensors provides additional advantages in reliably identifying the phase of the conductors. It should be appreciated that since these connections are made at the transformer, the labels and markings on the transformer allow the repair personnel to know which conductor is associated with which phase.

The current sensors 108, 110, 112 may be any type of sensor that is capable of detecting the presence of electrical current on a conductor. In the exemplary embodiment, the current sensors 108, 110, 112 are current transformers. In general, a current transformer is a device that has a primary winding and a secondary winding. Current is induced in the secondary winding due to magnetic fields generated by alternating current in primary winding. The current in the secondary winding is proportional to the current flowing in the primary. Current transformers provide a convenient means for measuring large currents by isolating the measuring equipment from the high current conductor. The current transformer also provides advantages in that it allows measurement of the current without disrupting or directly coupling to the target circuit. In the exemplary embodiment, the current transformers 108, 110, 112 are coupled to the individual phase conductors to generate a current that is proportional the current flowing through the individual phase conductors.

Figure 4:
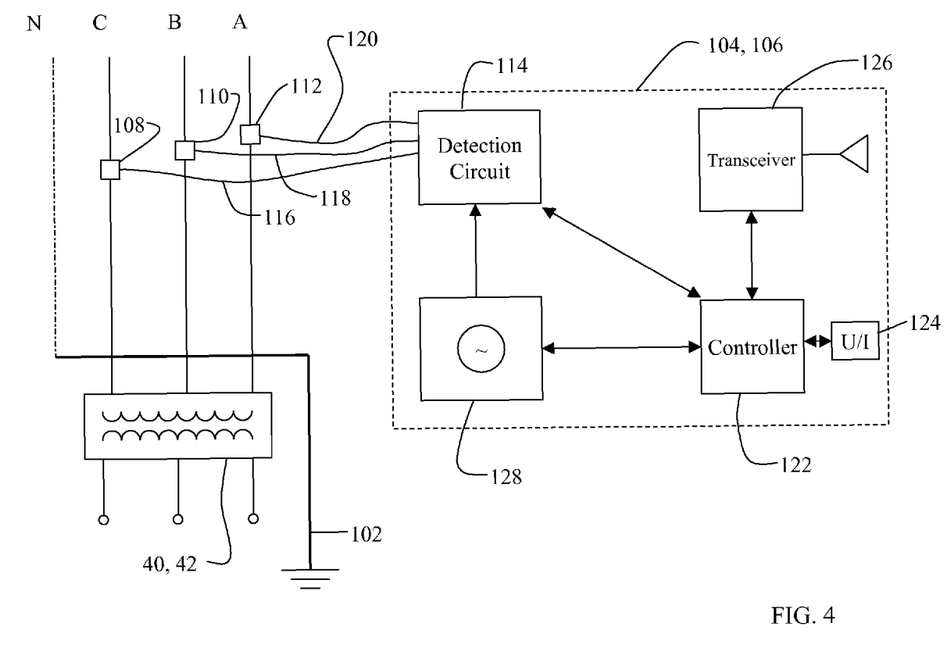
FIG. 4 is a schematic illustration of an exemplary embodiment receiver unit for the phase identification system of FIG. 3.

The receiver unit 104, 106 includes a detection circuit 114 as shown in FIG. 4. The detection circuit 114 is coupled to the current sensors 108, 110, 112 by leads 116, 118, 120 respectively. Detection circuit 114 is capable of converting the analog voltage or current level provided by sensors 108, 110, 112 into a digital signal indicative of the current signal on conductors 54, 56, 58, 60, 62 64. Alternatively, sensors 108, 110, 112 may be configured to provide a digital signal to detection circuit 114 or a controller 122, or an analog-to-digital (A/D) converter maybe coupled between sensors 108, 110, 112 and detection circuit 114 to convert the analog signal provided by sensors 108, 110, 112 into a digital signal for processing by controller 122.

The detection circuit 114 transmits a signal to a controller 122. The controller may be any suitable control device capable of receiving multiple inputs and providing control functionality to multiple devices based on the inputs. The controller 122 is capable of accepting data and instructions, executing the instructions to process the data, and presenting the results. Controller 122 may accept instructions through user interface 124, or through other means such as but not limited to electronic data card, voice activation means, manually operable selection and control means, radiated wavelength and electronic or electrical transfer. Therefore, controller 122 can be a microprocessor, microcomputer, a minicomputer, an optical computer, a board computer, a complex instruction set computer, an ASIC (application specific integrated circuit), a reduced instruction set computer, an analog computer, a digital computer, a molecular computer, a quantum computer, a cellular computer, a superconducting computer, a supercomputer, a solid-state computer, a single-board computer, a buffered computer, a computer network, a desktop computer, a laptop computer, or a hybrid of any of the foregoing.

Controller 122 uses the digital signals to act as input to various processes, including but not limited to a Fast Fourier Transform (FFT) signal analysis for determining if a current signal is being transmitted over the conductors. As will be discussed in more detail below, the FFT signal analysis allows the controller 122 to determine the level and frequency of the current signal. Thus, the controller 122 can distinguish the desired current signals from erroneous currents induced by surrounding power lines.

Data received from sensors 108, 110, 112 may be displayed on user interface 124, which is coupled to controller 122. User interface 124 may be an LED (light-emitting diode) display, an LCD (liquid-crystal diode) display, a CRT (cathode ray tube) display, or the like. A keypad may be coupled to user interface 124 for providing data input to controller 122.

A data communications transceiver 126 is coupled to receive signals from the controller 122. As will be discussed below, when the controller 122 detects a current on the conductors, a signal is transmitted via the data communications transceiver 126 indicating which conductor phase the current signal was detected. The signal may also incorporate an identification data indicating either the receiver unit ID or the transformer ID. The data communications transceiver 126 may be a wired or wireless communications device, such as but not limited to a cellular modem, a code division multiple access (CDMA) modem, a global system for mobile (GSM) communications modem, a universal mobile telecommunications system (UMTS) modem. The communications transceiver 126 may also be based on other protocols or communications technologies including but not limited to: TCP/IP, IEEE 802.11, RS-232, RS-485, Modbus, IrDA, infrared, radio frequency, electromagnetic radiation, microwave, power-line, telephone, fiber-optics, barcode, and laser Alternatively, the communications transceiver 126 may couple the Controller 122 to external computer networks such as a local area network (LAN) and the Internet. The LAN interconnects one or more remote computers, which are configured to communicate with controller 122 using a well-known computer communications protocol such as TCP/IP (Transmission Control Protocol/Internet Protocol), RS-232, ModBus, and the like. Additional receiver units 104, 106 may also be connected to LAN with the controllers 122 in each of these receiver units being configured to send and receive data to and from remote computers. LAN may be connected to the Internet. This connection allows controller 122 to communicate with one or more remote computers connected to the Internet.

Controller 122 includes operation control methods embodied in application code. These methods are embodied in executable computer instructions written to be executed by a processor, typically in the form of software. The software can be encoded in any language, including, but not limited to, assembly language, VHDL (Verilog Hardware Description Language), VHSIC HDL (Very High Speed IC Hardware Description Language), Fortran (formula translation), C, C++, Visual C++, Java, ALGOL (algorithmic language), BASIC (beginners all-purpose symbolic instruction code), visual BASIC, ActiveX, HTML (HyperText Markup Language), and any combination or derivative of at least one of the foregoing. Additionally, an operator can use an existing software application such as a spreadsheet or database and correlate various cells with the variables enumerated in the algorithms. Furthermore, the software can be independent of other software or dependent upon other software, such as in the form of integrated software.

The controller 122 may include further components as necessary to perform the execution of the computer instructions. These components include processors, random access memory (RAM), read only memory (ROM), nonvolatile memory (NVM) and I/O controllers. The ROM device stores an application code, e.g., main functionality firmware, including initializing parameters, and boot code, for a processor. Application code also includes program instructions for causing a processor to execute any dead-line phase identification operation control methods. A NVM device is any form of non-volatile memory such as an EPROM (Erasable Programmable Read Only Memory) chip, a disk drive, or the like. Stored in NVM device are various operational parameters for the application code. The various operational parameters can be input to NVM device either locally, using user interface 124 or a remote computer, or remotely via the Internet using remote computer. It will be recognized that application code can be stored in NVM device rather than a ROM device.

A power supply 128 is coupled to the controller 122, the detection circuit 114 and the transceiver 126 to provide the electrical power need by the components and circuits discussed above. The power supply 128 may be self-contained, such as a battery for example, that transmits a direct current (DC) electrical power to the receiver unit 104, 106. Alternatively, the power supply 128 may connect to an external power source, such as a 120V, 60 Hz outlet for example, and convert the electrical power to have the characteristics needed by the receiver unit 104, 106.

Referring back to FIG. 3, once the transformers 40, 42 have been grounded, utility personnel may proceed to prepare the section having an open circuit condition. The utility personnel first prepare the conductors by removing a sufficient amount of insulation from each cable to expose enough of the conductor portion to allow it to be spliced with the corresponding conductor on the opposite side of the open circuit point. The service personnel then couple a test lead 132 from transmitter unit 130 to one of the conductors that has been prepared for splicing. A second lead 134 from transmitter unit 130 is coupled to the neutral to complete the circuit.

Figure 5:
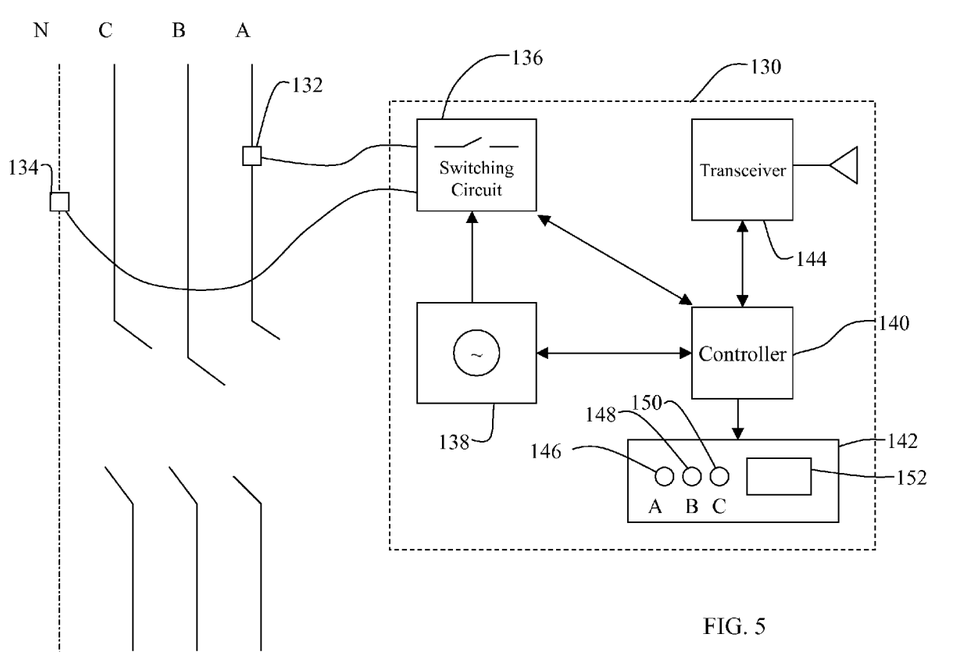
FIG. 5 is a schematic illustration of an exemplary embodiment transmitter unit for the phase identification system of FIG. 3.

The transmitter unit 130 is described in reference to FIG. 5. The leads 132, 134 are coupled to a switching circuit 136. As will be discussed below, the switching circuit applies a current signal from power supply 138 to the test lead 132 and the conductor to which it is connected. A controller 140 is coupled to the switching circuit 140 and power supply 138. The controller 140 is substantially similar in construction to controller 122 above. The controller 140 is capable of accepting data and instructions, executing the instructions to process the data, and presenting the results. Controller 140 may accept instructions through user interface 142, or through other means such as but not limited to electronic data card, voice activation means, manually operable selection and control means, radiated wavelength and electronic or electrical transfer.

As was discussed above with reference to controller 122, controller 140 is includes operation control methods embodied in application code. These methods are embodied in executable computer instructions written to be executed by a processor, typically in the form of software. The software can be encoded in any language, including but not limited to those discussed above with respect to controller 122. The controller 122 further has additional components, such as processors, ROM, RAM, NVM and I/O controllers to perform the executable computer instructions, transmit and receive signals.

The controller 140 is coupled to receive signals from receiver units 104, 106 via communications receiver device 144. The communications transceiver 144 is arranged to communicate with the communications transceiver 126 and therefore will include communications protocols that are compatible with the communications transceiver 126. As such, the communications transceiver 144 may be a cellular modem, a code division multiple access (CDMA) modem, a global system for mobile (GSM) communications modem, a universal mobile telecommunications system (UMTS) modem. The communications transceiver 126 may also be may also be based on other protocols or communications technologies including but not limited to: TCP/IP, IEEE 802.11, RS-232, RS-485, Modbus, IrDA, infrared, radio frequency, electromagnetic radiation, microwave, power-line, telephone, fiber-optics, barcode, and laser. The communications transceiver 126 may further be connected and communicate via a LAN or the Internet.

The data received from communications transceiver 144 may be displayed on user interface 142, which is coupled to controller 140. User interface 142 may be an LED (light-emitting diode) display, an LCD (liquid-crystal diode) display, a CRT (cathode ray tube) display, or the like. A keypad may be coupled to user interface 142 for providing data input to controller 140. In the exemplary embodiment, the user interface 142 includes three LED indicators, one for the "A" phase 146, one for the "B" phase 148, and one for the "C" phase 150. During operation, when the receiver unit detects a current signal on one of the conductors, a signal is transmitted to the transmitter unit 130 and the controller 140 activates the LED 146, 148, 150 that corresponds to the phase the current signal was detected. In one embodiment, the user interface 142 also includes a display 152 that indicates which receiver unit 104, 106 received the current signal.

In operation, the utility personnel couple the test lead 132 to one of the conductors at the location of the open circuit. The neutral lead 134 is coupled to the neutral. A removable device, such as an alligator clamp for example, may accomplish the coupling of the leads 132, 134. Once the connections have been made, the utility personnel activate the transmitter 130 using user interface 142. The controller 140 transmits a current signal from power supply 138 via switching circuit 136. The signal is transmitted into the conductor, conductor 54 for example. In the exemplary embodiment, the current signal generated by the transmitter unit 130 is between a first and second current threshold and at a predefined voltage, such as 12 volts and between 1.5 amps-12 amps, and preferably between 6 amps-10 amps for example. In some embodiments, the frequency of the current signal is below a first threshold, such as between 30 Hz-45 Hz for example. In other embodiments, the frequency of the current sign above a second threshold, such as 80 Hz-100 Hz for example. During testing of the exemplary embodiment, an injection current signal of approximately 12 volts, 9.2 Amps at frequency of 30-45 Hz was transmitted and detected by a receiver unit 13 miles away. It should be appreciated that it is advantageous to utilize frequencies that are not close to 60 Hz which allows the receiver unit 104, 106 to filter out any 60 Hz signals it may detect. It is desired to filter out the 60 Hz signals since these may be induced in the cable 50 by surrounding electrical transmission cables.

Once the current signal is generated by the transmitter unit 130, the signal should be received by one of the sensors 108, 110, 112. If the current signal was transmitted on conduit 54 as used in the example above, then the current sensor 112 will receive and detection circuit 114 will detect the current signal. The controller 122 performs a FFT signal analysis and filters out any signals in the 60 Hz region. If a signal meeting the predetermined characteristics or thresholds is detected (e.g. having a frequency between 30 Hz-45 Hz or 80 Hz-100 Hz), the controller 122 transmits a signal via communications transceiver 126 to the transmitter unit 130.

Upon receiving a signal from receiver unit 104, the controller 140 activates the appropriate LED on user interface 142. In the example above, where the current signal was transmitted on conductor 54, the controller would activate LED 146, which would indicate to the utility personnel that the test lead 132 is coupled to the "A" phase. The utility personnel then label the conductor with the appropriate phase and move the test lead to the next conductor. This process is repeated until all of the conductors have been identified and properly labeled. The conductors and neutral may then be spliced together and electrical service restored.

The dead-line phase identification system 100 provides a number of advantages in reducing costs and reducing the amount of time to complete repairs and restore electrical service. Since the identification signal is sent wirelessly, the process may be conducted with one utility personnel located at the site of the open circuit. The detecting device is placed at the transformer location when the ground is placed and removed, hence no additional trip is required to the transformer. This avoids the need for additional personnel to travel from the transformer to the open circuit site and back again. In addition, the Splicer is non productive during the time the phases are established when using the present method. This is especially advantageous when multiple open circuits are occurring during high load periods and crewing is scarce. Further, the embodiments described herein may be utilized when open circuit failures occur.

Figure 6:
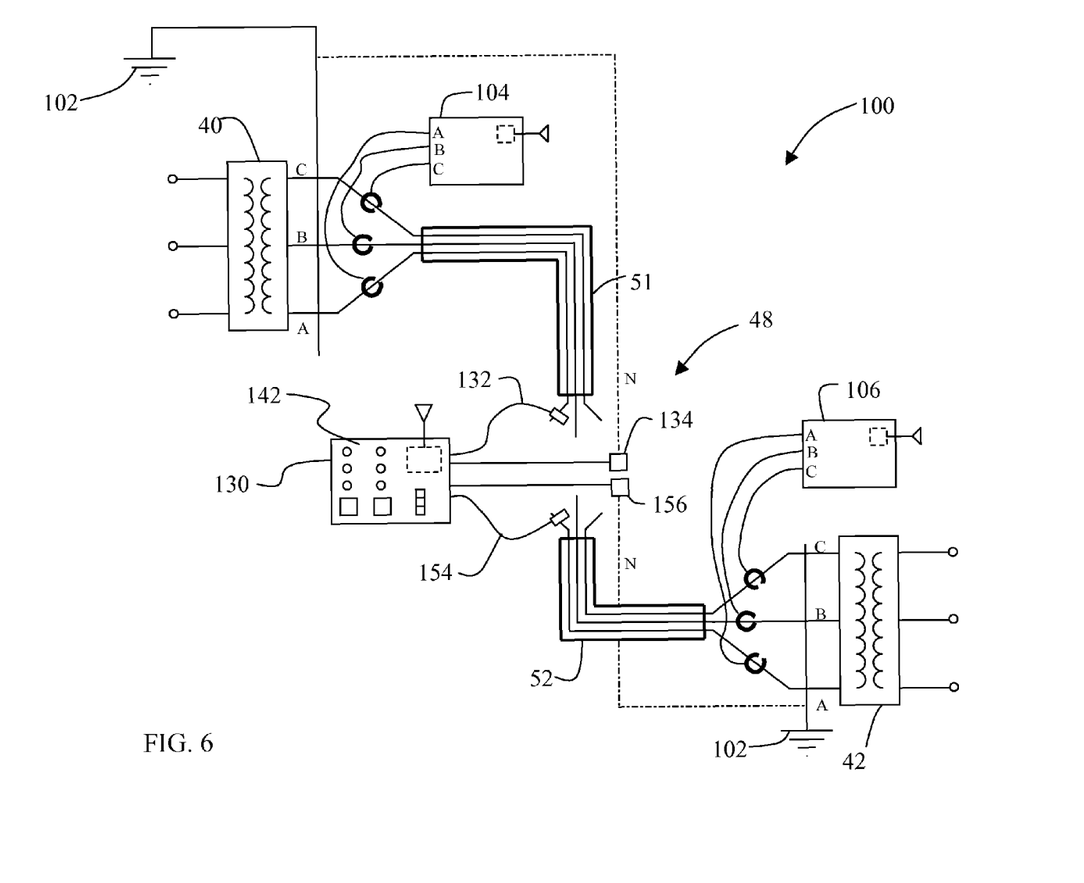
FIG. 6 is a schematic illustration of an alternate embodiment dead-line phase identification system.

An alternate embodiment dead-line phase identification system 100 is illustrated in FIG. 6. This arrangement allows the utility personnel to test the conductors on both cable sections 51, 52 simultaneously. This further saves time during the identification of the phases. The transmitter unit includes a user interface 142 indicators corresponding to the test leads 132, 134 and 154, 156. This arrangement allows for the testing of both sides of the open circuit simultaneously.

Figure 7:
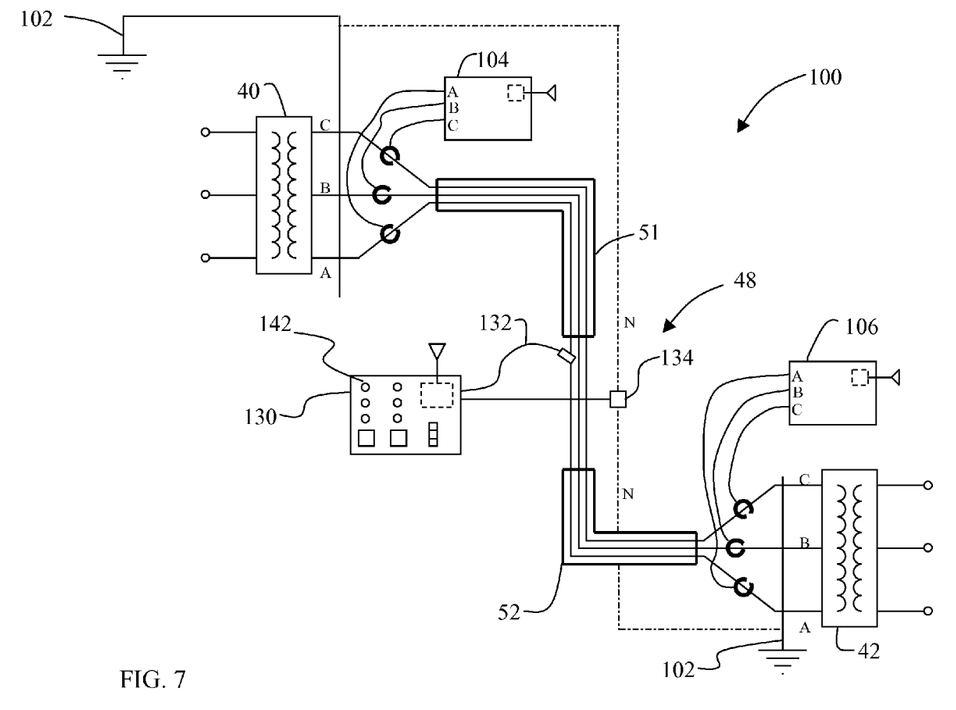
FIG. 7 is a schematic illustration of the phase identification system of FIG. 6 arranged to validate the splice repair.

Another embodiment provides further advantages in validating the spliced conductors simultaneously in both directions before energizing the cable 50 as illustrated in FIG. 7. Once the splices have been completed, the utility personnel may validate the splice by placing the test leads 132, 154 on each of the conductors in turn. The current signal is transmitted as before except that the signals are transmitted in both directions, meaning towards transformer 40 and transformer 42 simultaneously. If the splice has been performed correctly, then the LED's that correspond to the same phase for each transformer 40, 42 should activate on the user interface 124. In this way, the utility personnel may validate the splice before applying the insulator devices around the conductor.

Figure 8:
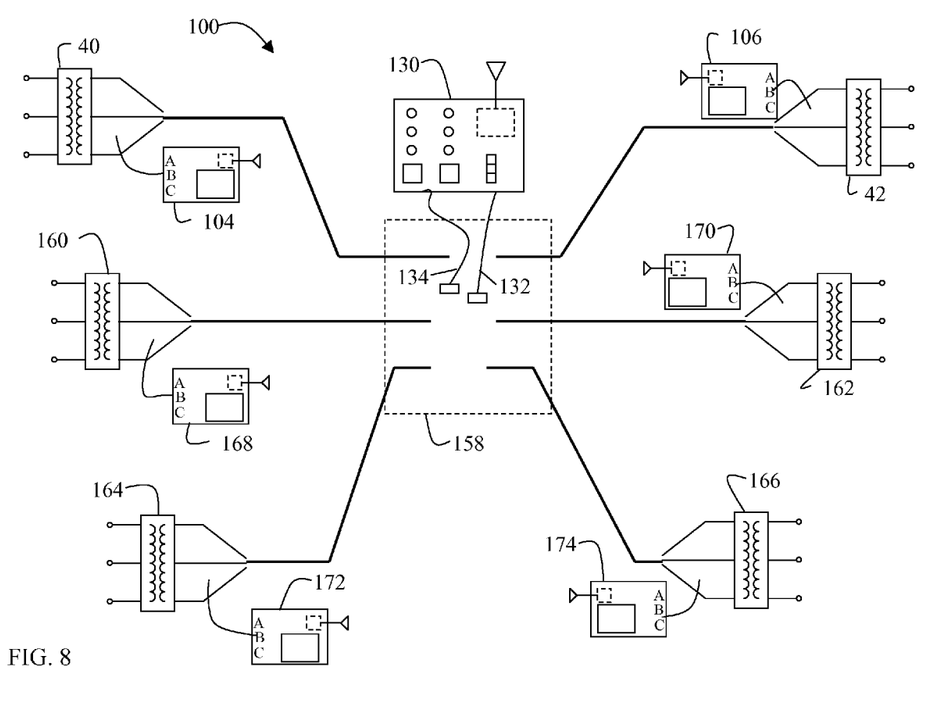
FIG. 8 is a schematic illustration of an alternate embodiment dead-line phase identification system.

Another alternate embodiment is illustrated in FIG. 8. In this embodiment, the open circuit in the distribution network 24 occurs in a location having multiple electrical transmission conductors in close proximity. A failure or open circuit of one of the electrical transmission conductors may result in damage to the surrounding transmission conductors as well. In this embodiment, the utility personnel must enter the area 158 where the failure occurred, sometimes referred to as a splicing pit, and not only identify the conductors phase, but also which transformer the conductor is associated with.

As before, one or more utility crews ground each of the affected transformers 40, 42, 160, 162, 164, 166. Once the transformers are grounded, receiver units 104, 106, 168, 170, 172, 174 are coupled to their respective transformers. In the exemplary embodiment, the utility crew inputs a transformer identification, such as a location or serial number for example, into each of the receiver units via their respective user interfaces. Alternatively, each transformer may have an identifier, such as a serial number or a location designation for example, and the utility crew contacts the personnel located at the splicing pit 158 and notifies them of which receiver unit is located at a particular transformer. In one embodiment, the receiver units are permanently maintained at the respective transformers and activated for operation once the transformer has been grounded With the transformers grounded, the utility personnel may enter the splicing pit 158 and prepare the conductors for splicing. The identification of the phases proceeds as before with the utility personnel attaching the test lead 132 to a conductor and the transmission of the current signal. In this embodiment, the receiver units, in addition to transmitting a signal of which phase the current signal was detected, also transmit data on the identity of the receiver unit, or the location of the transformer entered by the utility crew.

Figure 9:
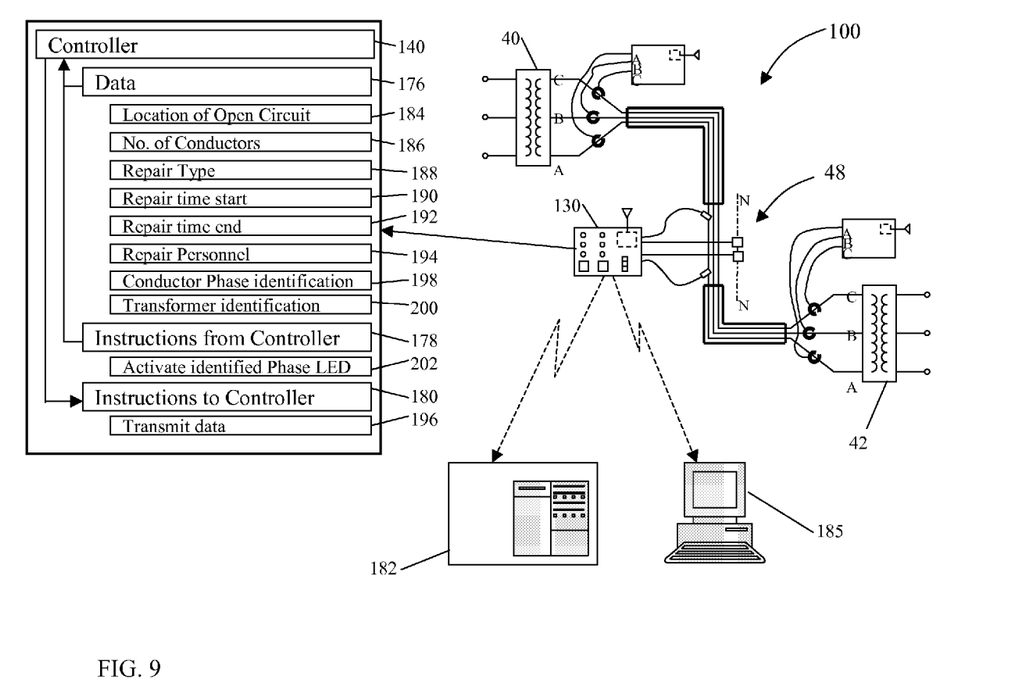
FIG. 9 is a schematic illustration of another alternate embodiment phase identification system.

In another alternate embodiment illustrated in FIG. 9, the controller 140 includes methods and instructions for communicating with a central location. In this embodiment, there is shown the transmitter unit 130 including controller 140. The controller 140 receives input and output data 176, and instructions 178, 180. The data 176 may come from a variety of sources, such as transmitted data, database data, transformer data, operator input data, and other data. The data 176 may also be described in terms of the type of information represented by the data, such as the location of the open circuit 184, the number of conductors involved 186, the type of repair made 188, the repair start time 190, the repair end time 192; the identification of the repair personnel 194; the identification of the conductor on which the current signal was detected 198, and the identification of the transformer where the current signal was detected 200. The controller 140 may further receive instruction inputs 180 that include the activating 202 of an LED on user interface 142.

The data and instruction outputs from transmitter unit 130 may be transmitted to a central control 182, a shift supervisor 185, the transformers 40, 42, or another controller associated with the main distribution network 24. This data may be used advantageously to help in the cost effective and efficient scheduling of the repair personnel for example. The controller may also receive instruction inputs 196 that the data may require transmitting the data using several different communication protocols, such as an email to a shift supervisor for example. The data could indicate that the repair has been or is nearing completion. This data can then be used advantageously by the shift supervisor to reallocate resources in a more efficient manner, such as by sending crews to retrieve the receiver units from the transformer for example. This data may further be used as a historical record of the repair and allow the utility to track performance and reliability of the distribution network 24 over time.

It should be appreciated that while the embodiments described herein refer to the device 130 and the devices 104, 106 as being the "transmitter" and "receiver" respectively, the functionality of these devices many be reversed without deviating from the scope of the claimed invention. For example, the device 104 may transmit a signal that is received by the device 130. Alternatively, the device 130 may be positioned adjacent the transformer 40 while the device 104 is positioned at the location of the break in cable 50.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system for identifying an electrical phase of a conductor in a three-phase electrical distribution network having an open circuit condition, said system comprising:
    a first current sensor configured to removably couple with a first phase conductor of said three-phase electrical distribution network distal from said open circuit condition;
    a first controller electrically coupled to said first current sensor;
    a first communications device electrically coupled to said first controller;
    a second communications device operably coupled to receive a signal from said first communications device;
    a second controller electrically coupled to said second communications device;
    a power supply electrically coupled to said second controller;
    a switching circuit electrically coupled to said power supply and said second controller; and,
    a test conductor coupled to said switching circuit and configured to removably couple with said first phase conductor adjacent said open circuit condition;
    wherein said second controller includes a first processor, said first processor being responsive to executable instructions for transmitting a first signal on said first phase conductor from said switching circuit through said test conductor;
    wherein said first controller includes a second processor, said second processor being responsive to executable computer instructions for detecting said first signal with said first current sensor and transmitting a second signal through said first communications device to said second communications device.

2. The system of claim 1 further comprising a neutral conductor electrically coupled to said switching circuit.

3. The system of claim 1, further comprising an indicator electrically coupled to said second controller, said second controller being responsive to executable computer instructions to activate said indicator in response to receiving said second signal from said first communications device.

4. The system of claim 1, further comprising a second current sensor electrically coupled to said first controller and a third current sensor electrically coupled to said first controller.

5. The system of claim 4, wherein said first current sensor, said second current sensor, and said third current sensors each include a current transformer.

6. The system of claim 5, wherein said first controller is responsive to executable computer instructions for transmitting said second signal with said first communications device in response to sensing said first signal with said first current sensor, said second current sensor or said third current sensor.

7. The system of claim 6, wherein said first controller is responsive to executable computer instructions for transmitting said second signal with said first communications device in response to detecting said first signal with said first current sensor, said second current sensor or said third current sensor when said first signal has a frequency below a predefined threshold.

8. The system of claim 6, wherein said first controller is responsive to executable computer instructions for transmitting said second signal with said first communications device in response to detecting said first signal with said first current sensor, said second current sensor or said third current sensor when said first signal has a frequency above a predefined threshold.

9. The system of claim 1 wherein said first communications device and said second communications device are wireless communications devices.

10. The system of claim 9 wherein said first communications device and said second communications device are wireless communications devices chosen from a group consisting of a cellular modem, a code division multiple access (CDMA) modem, a global system for mobile (GSM) communications modem, a universal mobile telecommunications system (UMTS) modem, a radio modem, a satellite modem, a IEEE 802.11 protocol modem, and a Bluetooth protocol based modem.

11. A system for identifying an electrical phase of a conductor in a three-phase electrical distribution network having an open circuit condition, said electrical distribution network having a phase conductor with a first end adjacent said open circuit condition and a second end adjacent a transformer, said system comprising:
    a receiver unit having first controller electrically coupled to a first sensor, said sensor being coupled to said second end, said receiver unit having a first communications device coupled to said first controller;
    a transmitter unit having a second controller electrically coupled to a second communications device, said transmitter unit having a switching circuit electrically coupled to said second controller and a conductor coupled between said switching circuit and said first end;

wherein said first controller includes a first processor, said first processor being responsive to executable computer instructions for transmitting a first signal with said switching circuit onto said first end with said conductor, said first signal having a frequency of less than 45 Hertz; and wherein said second controller includes a second processor, said second processor being responsive to executable computer instructions for detecting said first signal on said second end with said first sensor and transmitting a second signal with said second communications device to said first communications device in response to detecting said first signal.

12. The system of claim 11 wherein said switching circuit transmits said first signal at a frequency between 30 Hertz to 45 Hertz.

13. The system of claim 12 wherein said switching circuit transmits said first signal at a current of 1.5 amps to 12 amps.

14. The system of claim 13 wherein said first signal has a current between 6 amps to 10 amps.

15. The system of claim 14 wherein said first signal has a current of 9.2 amps.

16. The system of claim 11 wherein said second processor is further responsive to executable computer instructions for performing a FFT signal analysis on said first signal, said FFT signal analysis filtering out signals on said phase conductor having a frequency about 60 Hertz.

17. A system for identifying an electrical phase of a conductor in a three-phase electrical distribution network having an open circuit condition, said electrical distribution network having a phase conductor with a first end adjacent said open circuit condition and a second end adjacent a transformer, said system comprising:

a receiver unit having first controller electrically coupled to a first sensor, said sensor being coupled to said second end, said receiver unit having a first communications device coupled to said first controller;

a transmitter unit having a second controller electrically coupled to a second communications device, said transmitter unit having a switching circuit electrically coupled to said second controller and a conductor coupled between said switching circuit and said first end;

wherein said first controller includes a first processor, said first processor being responsive to executable computer instructions for transmitting a first signal with said switching circuit onto said first end with said conductor, said first signal having a frequency of greater than than 80 Hertz; and wherein said second controller includes a second processor, said second processor being responsive to executable computer instructions for detecting said first signal on said second end with said first sensor and transmitting a second signal with said second communications device to said first communications device in response to detecting said first signal.

18. The system of claim 17 wherein said switching circuit transmits said first signal at a frequency between 80 Hertz to 100 Hertz.

19. The system of claim 18 wherein said second processor is further responsive to executable computer instructions for performing a FFT signal analysis on said first signal, said FFT signal analysis filtering out signals on said phase conductor having a frequency about 60 Hertz.

* * * * *